(12) United States Patent
Brombolich

(10) Patent No.: US 7,321,365 B2
(45) Date of Patent: *Jan. 22, 2008

(54) COMPUTERIZED DEFORMATION ANALYZER

(75) Inventor: Daniel L. Brombolich, Saint Charles, MO (US)

(73) Assignee: Siemens Product Lifecycle Management Software Inc.

( * ) Notice: Subject to any disclaimer, the term of this patent is extended or adjusted under 35 U.S.C. 154(b) by 0 days.

This patent is subject to a terminal disclaimer.

(21) Appl. No.: 11/305,834

(22) Filed: Dec. 16, 2005

(65) Prior Publication Data

US 2006/0158449 A1    Jul. 20, 2006

Related U.S. Application Data

(63) Continuation of application No. 10/161,270, filed on May 31, 2002, now Pat. No. 7,027,048.

(51) Int. Cl.
*G06T 17/00* (2006.01)

(52) U.S. Cl. ............... 345/420; 345/419; 345/421; 345/424; 700/97; 702/42; 703/1; 703/7; 716/9

(58) Field of Classification Search ............... 345/419, 345/420, 421, 424; 700/97; 702/42; 703/1, 703/7; 716/9
See application file for complete search history.

(56) References Cited

U.S. PATENT DOCUMENTS

| | | | |
|---|---|---|---|
| 5,390,127 A | 2/1995 | Tang et al. | 364/472 |
| 6,044,210 A | 3/2000 | Nagtegaal | 716/9 |
| 6,069,634 A | 5/2000 | Gibson | 345/424 |
| 6,205,366 B1 | 3/2001 | Tang et al. | 700/97 |
| 6,212,486 B1 | 4/2001 | Huang et al. | 703/7 |
| 6,263,252 B1 | 7/2001 | St. Ville | 700/98 |
| 6,369,815 B1 | 4/2002 | Celniker et al. | 345/420 |
| 6,560,570 B1 | 5/2003 | Dohrmann et al. | 703/7 |
| 6,704,693 B1 | 3/2004 | Fan et al. | 703/1 |
| 6,714,901 B1 | 3/2004 | Cotin et al. | 703/7 |
| 6,778,916 B2 | 8/2004 | Lee | 702/42 |
| 6,947,879 B2 | 9/2005 | Yamada et al. | 703/2 |
| 2002/0072883 A1 | 6/2002 | Lim et al. | 703/2 |

OTHER PUBLICATIONS

PCT Notification of Transmittal of the International Search Report or the Declaration, mailed Mar. 12, 2004, including International Search Report re PCT/US 03/16489 (7 pgs.).

(Continued)

*Primary Examiner*—Kimbinh T. Nguyen

(57) ABSTRACT

According to one embodiment of the invention, a method for determining deformation of a surface of a material is provided. The method includes receiving, at a computer, an elastic deformation range and a plastic deformation range of the material. The method also includes modeling a region of the material with a mesh. The mesh includes a plurality of elements. The method also includes determining, by performing a finite element analysis on the mesh by the computer, a displacement for at least one point on each of the elements. The displacement results from a set of modeled boundary conditions. The finite element analysis includes recurrently approximating the modulus of elasticity for each element according to the elastic deformation range and the plastic deformation range. The act of approximating is based on a value of strain calculated from a previously calculated element displacement.

40 Claims, 6 Drawing Sheets

OTHER PUBLICATIONS

S.C. Tang and L.B. Chappuis, "Evaluation of Sheet Metal Forming Process Design by Simple Models", ASME Mater Div. Publ. MD, American Society of Mechanical Engineers, vol. 8, (19-26 pgs.), 1988.

Daniel L. Brombolich, "*Declaration of Daniel L. Brombolich Pursuant to 37 C.F.R. Sec. 1.132*," signed Apr. 12, 2004, (pp. 1-2).

Alan H. Barr, "*Global and Local Deformations of Solid Primitives*", Computer Graphichs, New York, N.Y., US, XP-002267388, vol. 18 (pp. 21-30), Jul. 1984.

Paul Borrel, "*Simple Constrained Deformation for Geometric Modeling and Interactive Design*", ACM Transactions on Graphics, Association for Computing Machinery, New York, US, XP 000461728, vol. 13, No. 2 (pp. 137-155), Apr. 1, 1994.

Andrew Witkin and William Welch, *Fast Anmiation and Control of Nonrigid Structures*, Computer Graphics, XP-002279233, vol. 24, No. 4 (pp. 243-252), Aug. 1990.

PCT Notification of Transmittal of The International Search Report or the Declaration dated Jun. 21, 2004 for PCT/US03/17191.

COMPUTERIZED DEFORMATION ANALYZER

RELATED APPLICATIONS

This application is a continuation of application Ser. No. 10/161,270, entitled "COMPUTERIZED DEFORMATION ANALYZER" filed on May 31, 2002, issued Apr. 11, 2006 as U.S. Pat. No. 7,027,048 B2.

TECHNICAL FIELD OF THE INVENTION

This invention relates generally to computer-aided modeling and more particularly to a computerized deformation analyzer.

BACKGROUND OF THE INVENTION

Mechanical devices are frequently designed using finite element analysis ("FEA") packages. For example, a FEA package may be used to model a hood of an automobile by generating a mesh that covers a piece of sheet metal. The FEA package then incrementally determines the deflection of each element of the mesh based on certain boundary conditions until the resulting shape of the entire mesh can be graphically depicted. The accuracy of the model generated by the FEA package is important because the results from the model are used in the actual manufacturing process. For example, if the model is not accurate, then the actual device manufactured based on the model may not end up with the desired shape.

The accuracy of a model generated by an FEA package may be increased by increasing the number of elements that form a particular mesh used in the modeling process. But the increase of elements also increases the required computation time because a non-linear FEA involves repeated computation of many equations that are associated with each element of a mesh. Supercomputers are used to accelerate the computation time of these models, but even such powerful computers may take days before a model is completed with the required accuracy.

SUMMARY OF THE INVENTION

According to one embodiment of the invention, a method for determining deformation of a surface of a material is provided. The method includes receiving, at a computer, an elastic deformation range and a plastic deformation range of the material. The method also includes modeling a region of the material with a mesh. The mesh includes a plurality of elements. The method also includes determining, by performing a finite element analysis on the mesh by the computer, a displacement for at least one point on each of the elements. The displacement results from a set of modeled boundary conditions. The finite element analysis includes recurrently approximating the modulus of elasticity for each element according to the elastic deformation range and the plastic deformation range. The act of approximating is based on a value of strain calculated from a previously calculated element displacement.

Some embodiments of the invention provide numerous technical advantages. Some embodiments may benefit from some, none, or all of these advantages. For example, according to some embodiments, an accurate model of a device may be generated, even for models undergoing large increment of displacement, without substantially increasing the number of elements in a mesh. A relatively small number of elements in a given mesh decreases the required computing power and time. According to another embodiment, the use of higher order elements also decreases the computing power and time required for accurate modeling by reducing the need for a large number of elements.

Other technical advantages may be readily ascertained by one of skill in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Example embodiments of the invention are best understood by referring to FIGS. 1A through 5D of the drawings, like numerals being used for like and corresponding parts of the various drawings.

Figure 1A:
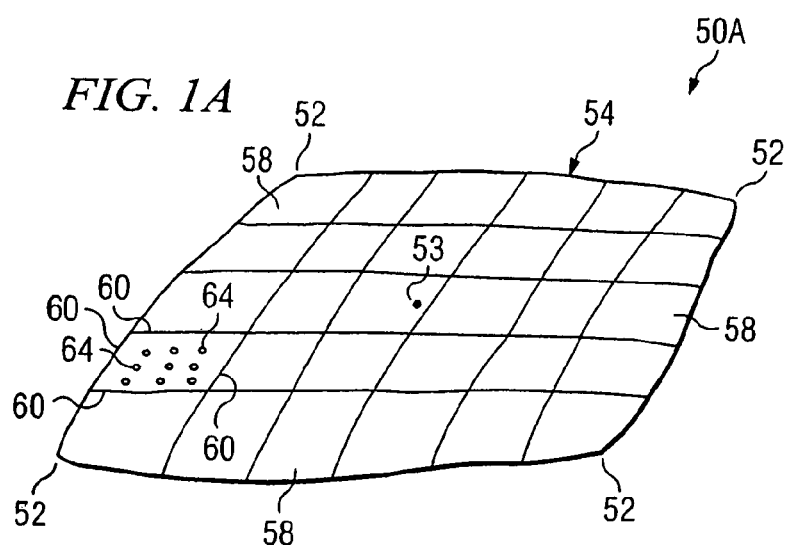
FIG. 1A is a schematic diagram illustrating an embodiment of an initial mesh that may be used in a method of finite element analysis.
Figure 1B:
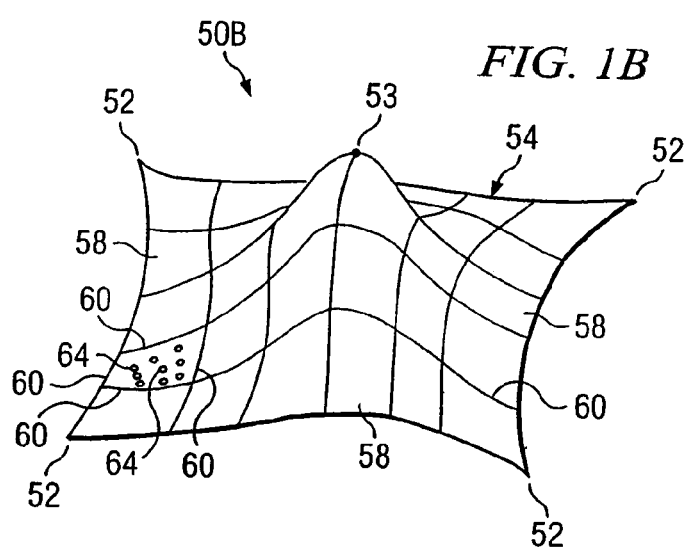
FIG. 1B is a schematic diagram illustrating an embodiment of a final mesh having a target shape, wherein the final mesh is a result of performing the method of finite element analysis.

FIGS. 1A and 1B illustrate modeling the forming of a material shown into a particular shape. An example of a material is sheet metal. A mesh 50A shown in FIG. 1A is an embodiment of a model of the material prior to the forming operation. A mesh 50B shown in FIG. 1B is an embodiment of a model of the material after the forming operation.

Mesh 50A and mesh 50B may be generated by a finite element analysis ("FEA") software program or an associated mesh generator (not explicitly shown). Mesh 50A and mesh 50B may be generated by any suitable process, including Parasolid faceting. In the embodiment shown in FIG. 1A, mesh 50A has four corners 52; however, depending on the geometry of a mesh, there may be more or less corners 52.

Mesh 50A models an identified region 54 of a material that will be deformed. Region 54 is an area of a material that is displaced to obtain a target shape. One or more boundary conditions may be imposed on mesh 50A to appropriately displace portions of mesh 50A so that mesh 50A models the displacement of region 54 of the material. Mesh 50A comprises a plurality of elements 58. Element 58 may have a simply shaped geometry, such as a triangle, quadrilateral, or other polygons. Although only quadrilaterals are shown in mesh 50A of FIG. 1A, any polygon or a combination of polygons may be used to form mesh 50A to model a particular geometry of the material. Each element 58 comprises one or more Gauss points 64. The Gauss points refer to the positions chosen for numerical integration. The particular number of Gauss points 64 may be chosen by one skilled in art, depending on the required accuracy of the model and the shape of element 58. Each element 58 is joined with another element 58 by at least one adjacent element edge 60.

Referring to FIG. 1B, mesh 50B is the result of shaping initial mesh 50A as being fixed at four corners 52 of mesh 50A and displacing a center 53 in an upward direction. The fixing of corners 52 and the displacement of center 53 may be imposed as boundary conditions of the FEA process. Although only center 53 is displaced upwards, that displacement results in the displacement of the surface of the material that surrounds center 53 as well as the edges of the material. These displacements are reactions to the movement of center 53, while fixing corners 52. Different materials may experience different type and level of displacements. For example, rubber may experience a more drastic displacement in its edges and the surrounding areas of a particular region that is moved because rubber behaves within the elastic material characteristics and not within the permanent plastic material characteristics. Furthermore, different boundary conditions may be imposed so that different restrictions and movements may be imposed on mesh 50A. Applying a different set of boundary conditions would result in a final mesh having a different shape than that of mesh 50B shown in FIG. 2B.

To accurately predict the resulting displacement of different materials for different movements, such as bending or stretching, a conventional FEA method uses a mesh having thousands of elements. The teachings of the invention recognize that such a high number of elements is required to compensate for the inaccuracy of the resulting model that may be caused by conditions not replicated by the FEA process. An example of a non-replicated condition is the change in material properties, and in particular the modulus of elasticity, due to incremental displacements. Many other conventional FEA packages are useful only for small displacements, which make them inaccurate tools for analyzing large displacements that may cause the material to undergo changes in material properties. Having more elements also requires a significant increase in computing time and power. Such an increase is necessary because each element is associated with at least one mathematical equation, referred to as shape functions, that are used to mathematically model the behavior of the material. All of these equations are solved together recurrently until all of the equations converge to a solution. To satisfy the required computing power, the manufacturing industry frequently uses supercomputers to perform these computations repeatedly until an acceptably accurate model of the device can be obtained. However, even the use of supercomputers may require days of computation time to obtain an acceptable model.

According to some embodiments of the present invention, a method is provided for increasing the accuracy of a model of a device by updating the non-uniform material properties, such as a modulus of elasticity, within each element during the iterative FEA process. This is advantageous because an accurate model of the device may be generated, even for models undergoing large displacements, without substantially increasing the number of elements in a mesh. A relatively small number of elements in a given mesh decreases the required computing power and time. Additional details of example embodiments of the system and method are described in greater detail below in conjunction with FIGS. 2 through 5D.

Figure 2:
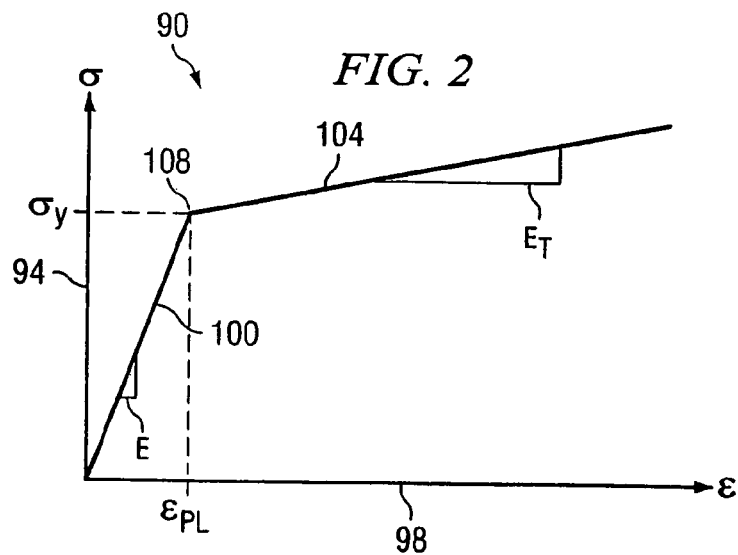
FIG. 2 is an example graph of a stress and strain relationship that is associated with an example material to be modeled.

FIG. 2 is an example graph 90 illustrating the modulus of elasticity in terms of a relationship between stress and strain of an example material. The phrase "modulus of elasticity" refers to the ratio of stress and strain of a material in both the elastic and plastic deformation ranges. The "elastic deformation range" or "elastic domain" refers to a range of strain under which the alteration of the form or dimensions of a solid body is reversible. The "plastic deformation range" or "plastic domain" refers to a range of strain that exceeds the stress limit of the elastic domain. The alteration of the form or dimensions of a solid body within the "plastic domain" or "plastic deformation range" is permanent but without fracture of the solid body. An axis 94 represents stress ("$\sigma$") and an axis 98 represents strain ("$\epsilon$"). In some embodiments where large displacements may occur during a forming process, it may be necessary to account for the transition from the elastic domain of the material into the plastic domain. In one embodiment, a point 108 representing the yield stress ("$\sigma_y$") of the material marks the transition from a segment 100 representing the elastic domain of the material to a segment 104 representing the plastic domain of the material. In one embodiment, the approximation of this elastic-plastic relationship may utilize a quasi-linear approach, where the elastic domain is approximated as a linear stress-strain relationship and the plastic domain is approximated as another linear stress-strain relationship. The slope of the elastic domain, segment 100, may be defined by the elastic modulus ("E"). The slope of the plastic domain, segment 104, is represented by the Tangent Modulus ("$E_T$").

With the model represented by graph 90, the stress-strain relationship may be defined as follows:

$$\sigma = \begin{cases} E\varepsilon & \varepsilon \leq \varepsilon_{PL} \\ \sigma_y + E_T(\varepsilon - \varepsilon_{PL}) & \varepsilon > \varepsilon_{PL} \end{cases} \quad (1), (2)$$

where $e_{PL}$ equals the strain at point 108.

The plastic range of this stress-strain relationship is defined by $E_T = d\overline{\sigma}/d\overline{\varepsilon}$ where ("$\overline{\sigma}$") refers to the "effective stress" and ("$\overline{\varepsilon}$") refers to the "effective strain". Substituting this equation into the relation, $$d\overline{\varepsilon} = \frac{d\overline{\sigma}}{E} + \frac{d\overline{\sigma}}{H'} \quad (3)$$

The Plastic Modulus may be determined as:

$$H' = \frac{EE_T}{E - E_T} \quad (4)$$

where H'=Effective stress-strain Slope.

Providing material properties, such as the stress-strain relationship shown in FIG. 2 and defined in Equations 1 and 2, is advantageous because the resulting model may more accurately depict the actual deformed shape of the material. Additionally, approximating the stress-strain relationship as a quasi-linear relationship is advantageous because such a linear approximation of the elastic deformation and plastic deformation simplifies the calculations involved with the FEA; however, the stress-strain relationship of the material may also be represented by non-linear functions or by empirical data. Mathematical simplification reduces the required computing time and power.

Figure 3A:
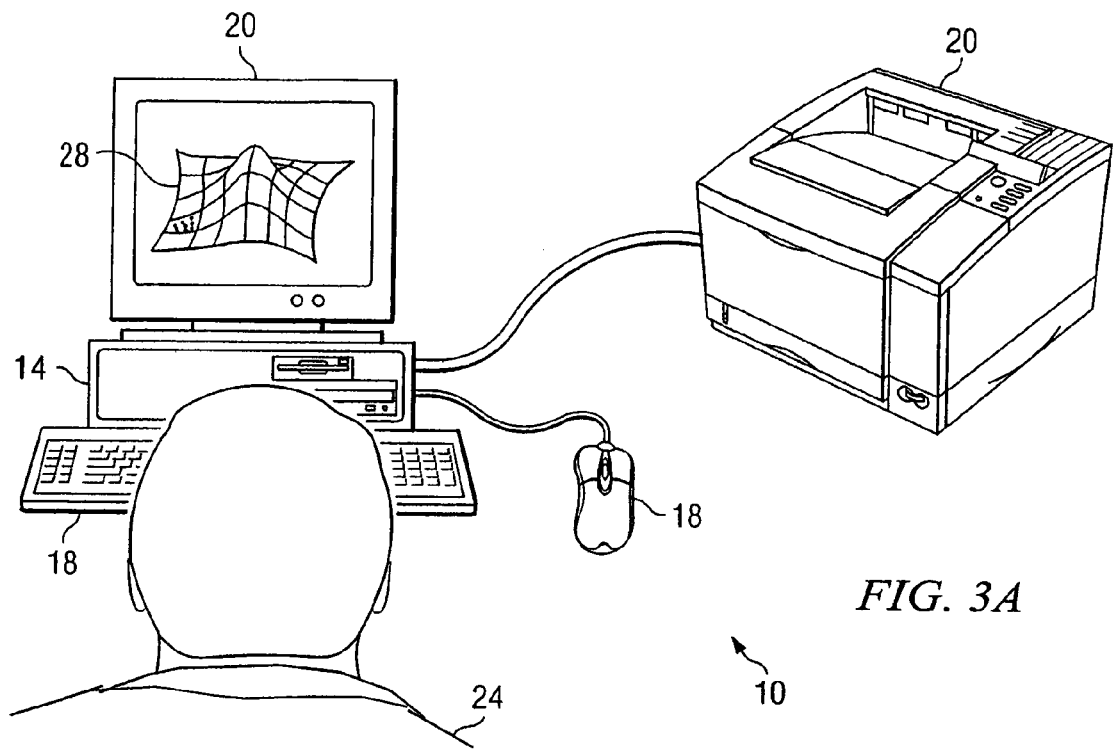
FIG. 3A is a schematic diagram illustrating an embodiment of a computer system operable to perform a method of finite element analysis according to one embodiment of the present invention.

FIG. 3A is a schematic diagram illustrating an embodiment of a computer system 10 for performing finite element analysis that may benefit from the teachings of the present invention. System 10 includes a computer 14 that is coupled to one or more input devices 18 and one or more output devices 20. A user 24 has access to system 10 and may utilize input devices 18 to input data and generate and edit a drawing 28 that may be displayed by any or all of output devices 20.

As shown in FIG. 3A, examples of input device 18 are a keyboard and a mouse; however, input device 18 may take other forms, including a stylus, a scanner, or any combination thereof. Examples of output devices 20 are a monitor of any type and a printer; however, output device 16 may take other forms, including a plotter. Any suitable visual display unit, such as a liquid crystal display ("LCD") or cathode ray tube ("CRT") display, that allows user 24 to view drawing 28, may be a suitable output device 20.

Figure 3B:
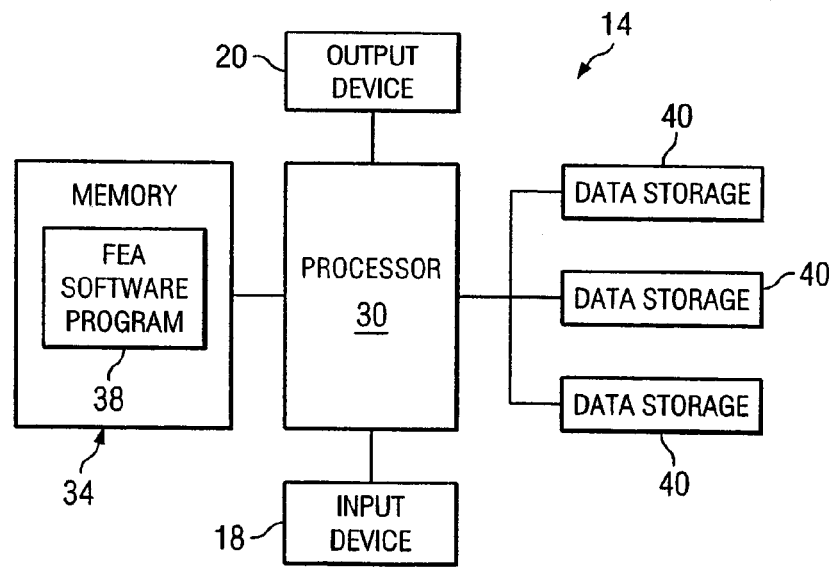
FIG. 3B is a block diagram illustrating an embodiment of a computer shown in FIG. 3A.

FIG. 3B is a block diagram of computer 14 for use in performing finite element analysis according to one embodiment of the present invention. As illustrated, computer 14 includes a processor 30, a memory 34 storing a FEA software program 38, and one or more data storage units 40 for storing data related to FEA software program 38 or other data.

Processor 30 is coupled to memory 34 and data storage unit 40. Processor 30 is operable to execute the logic of FEA software program 38 and access data storage unit 40 to retrieve or store data relating to drawings. Examples of processor 30 are the Pentium™ series processors, available from Intel Corporation.

Memory 34 and data storage unit 40 may comprise files, stacks, databases, or other suitable forms of data. Memory 34 and data storage unit 40 may be random-access memory, read-only memory, CD-ROM, removable memory devices, or any other suitable devices that allow storage and/or retrieval of data. Memory 34 and data storage unit 40 may be interchangeable and may perform the same functions.

FEA software program 38 is a computer program that allows user 18 to model a device through finite element analysis using computer 14. FEA software program 38 may be a part of a drawing application, such as a Computer-Aided Drafting ("CAD") package, or exist as an independent computer application. FEA software program 38 may reside in any storage medium, such as memory 34 or data storage unit 40. FEA software program 38 may be written in any suitable computer language, including C or C++. FEA software program 38 is operable to allow user 18 to input boundary conditions, such as an initial position of a curve and a final position of a curve, so that a resulting predicted shape may be displayed on output device 20 and/or stored in data storage unit 40. An example FEA software program 38 that may incorporate the teachings of the invention is Region Analyzer™, available from Unigraphics Solutions, Inc.

Figure 4A:
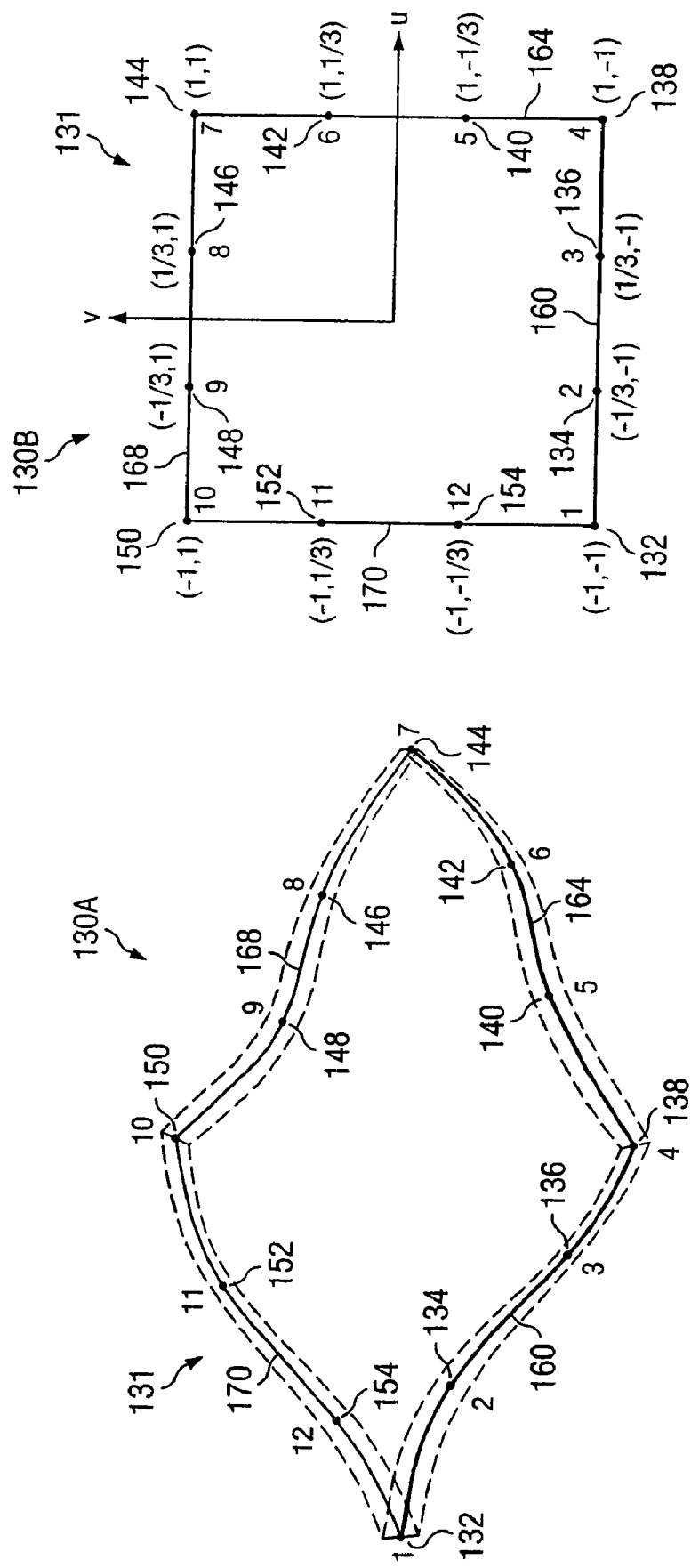
FIG. 4A is a schematic diagram of an embodiment of the element of the initial mesh shown in FIG. 2A.

FIG. 4A is a schematic diagram of an embodiment of a quadrilateral element 130A of a mesh, such as initial mesh 50A shown in FIG. 2A. In some embodiments, element 130A may be a shell element. A shell element refers to a geometry that has a thickness associated with it, as shown in FIG. 4A. Element 130A comprises a plurality of nodes 132 through 154 that are positioned on element edges 160, 164, 168, and 170 of element 130A. Nodes 132 through 154 are jointly referred to as nodes 131. Nodes 131 are used as references for determining displacements of the various portions of element 130A. In the embodiment shown in FIG. 4A, element 130A has twelve nodes 131; however, more or less nodes may be used. Nodes 132, 138, 144, and 150 are corner nodes. Nodes 134, 136, 140, 142, 146, 148, 152, and 154 are mid-side nodes. Local coordinate positions of nodes 131 are shown on a model 130B of element 130A.

As a part of the FEA process, respective shape functions N of nodes 131 are determined. The shape functions associated with nodes 131 are described below. As used in these equations, the following relationships between reference numerals and node numbers (i) in FIG. 4A are used: 132=node 1, 134=node 2, 136=node 3, 138=node 4, 140=node 5, 142=node 6, 144=node 7, 146=node 8, 148=node 9, 150=node 10, 152=node 11, and 154=node 12.

$$N_i = \frac{1}{32}(1+U_iU)(1+V_iV)[9(U^2+V^2)-10] \quad i=1,4,7,10 \quad (5)$$

$$N_i = \frac{9}{32}(1+U_iU)(1-V^2)(1+9V_iV) \quad i=5,6,11,12 \quad (6)$$

$$N_i = \frac{9}{32}(1+V_iV)(1-U^2)(1+9U_iU) \quad i=2,3,9,8 \quad (7)$$

where $N_i$=Shape function associated with node i,
  U=Parametric value in U-direction of element,
  V=Parametric value in V-direction of element,
  $U_i$=Parametric value in U-direction of node i, and
  $V_i$=Parametric value in V-direction of node i.

The partial derivatives of the shape functions associated with nodes 131 are used in a finite element analysis, as described in greater detail below. The partial derivatives are as follows:

$$\frac{\partial N_i}{\partial U} = \frac{1}{32}[(27U^2+9V^2-10)\cdot U_i+18U]\cdot(1+V_iV) \quad i=1,4,7,10 \quad (8)$$

$$\frac{\partial N_i}{\partial V} = \frac{1}{32}[(27V^2+9U^2-10)\cdot V_i+18V]\cdot(1+U_iU) \quad (9)$$

$$\frac{\partial N_i}{\partial U} = \frac{9}{32}(1-V^2)(1+9V_iV)U_i \quad i=5,6,11,12 \quad (10)$$

$$\frac{\partial N_i}{\partial V} = \frac{9}{32}[2V+27V_iV^2-9V_i]\cdot(1+U_iU) \quad (11)$$

$$\frac{\partial N_i}{\partial U} = \frac{9}{32}[2U+27U_iU^2-9U_i]\cdot(1+V_iV) \quad i=2,3,9,8 \quad (12)$$

$$\frac{\partial N_i}{\partial V} = \frac{9}{32}(1-U^2)(1+9U_iU)V_i \quad (13)$$

Figure 4B:
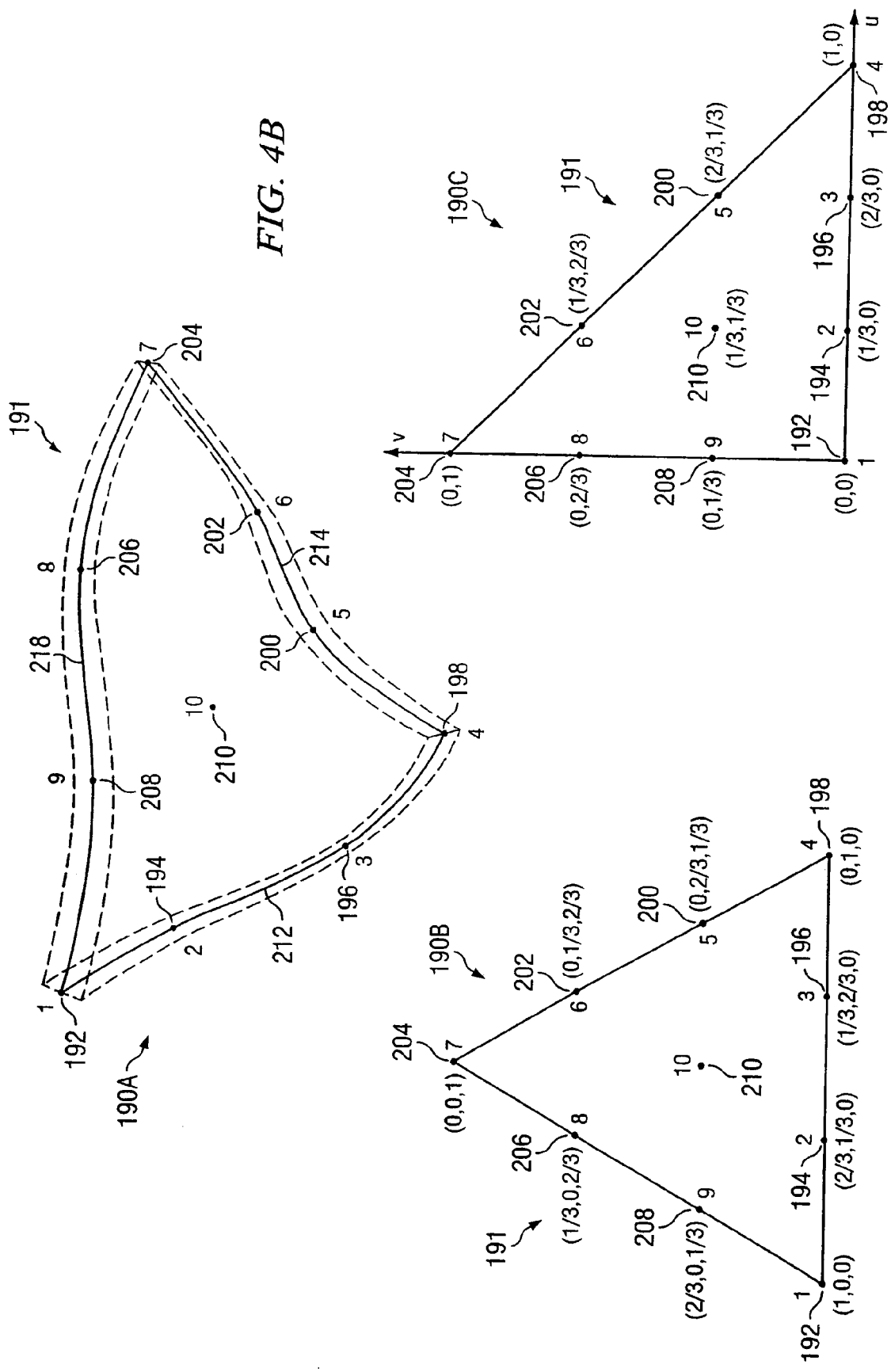
FIG. 4B is a schematic diagram of an embodiment of the element of the initial mesh shown in FIG. 2A.

FIG. 4B is a schematic diagram of an embodiment of a triangular element 190A of an initial mesh, such as initial mesh 50A shown in FIG. 2. In some embodiments, element 190A is a shell element, as shown in FIG. 4B. Element 190A comprises a plurality of nodes 192 through 208 that are positioned on nodal lines 212, 214, and 218 of element 190A. Nodes 192 through 208 are jointly referred to as nodes 191. Nodes 191 are used as references for determining displacements of the various portions of element 130A. In the embodiment shown in FIG. 4B, element 190A has ten nodes 191; however, more or less nodes may be used. Nodes 192, 198, and 204 are corner nodes. Nodes 194, 196, 200, 202, 206, and 208 are mid-side nodes. Node 210 is a center node. Local coordinates of nodes 192 through 210 are shown on a model 190B of element 190A. As a part of the FEA process, respective shape functions N of nodes 191 are determined and described below. As used in these equations, the following relationships between reference numerals and node numbers (i) are used: 192=node 1, 194=node 2, 196=node 3, 198=node 4, 200=node 5, 202=node 6, 204=node 7, 206=node 8, 208=node 9, and 210=node 10.

$$N_1 = \frac{1}{2}(3L_1 - 1)(3L_1 - 2)L_1 \tag{14}$$

$$N_2 = \frac{9}{2}L_1L_2(3L_1 - 1) \tag{15}$$

$$N_3 = \frac{9}{2}L_1L_2(3L_2 - 1) \tag{16}$$

$$N_4 = \frac{1}{2}(3L_2 - 1)(3L_2 - 2)L_2 \tag{17}$$

$$N_5 = \frac{9}{2}L_2L_3(3L_2 - 1) \tag{18}$$

$$N_6 = \frac{9}{2}L_2L_3(3L_3 - 1) \tag{19}$$

$$N_7 = \frac{1}{2}(3L_3 - 1)(3L_3 - 2)L_3 \tag{20}$$

$$N_8 = \frac{9}{2}L_1L_3(3L_3 - 1) \tag{21}$$

$$N_9 = \frac{9}{2}L_1L_3(3L_1 - 1) \tag{22}$$

$$N_{10} = 27L_1L_2L_3 \tag{23}$$

where $N_i$=Shape function associated with node i,
$L_1$=Magnitude of shape function between $1^{st}$ node and adjacent edge,
$L_2$=Magnitude of shape function between $2^{nd}$ node and adjacent edge, and
$L_3$=Magnitude of shape function between $3^{rd}$ node and adjacent edge.

In some embodiments, it is desirable to define the shape functions for this 10-noded triangular element 190A in terms of two independent variables (u,v) representing a 2-dimensional parametric range, instead of three independent variables ($L_1,L_2,L_3$). Using the relation $L_1+L_2+L_3=1$, these shape functions may be rewritten in terms of the independent variables, $L_2$ and $L_3$ as:

$$N_1 = \frac{1}{2}(3(1 - L_2 - L_3) - 1)(3(1 - L_2 - L_3) - 2)(1 - L_2 - L_3) \tag{24}$$

$$N_2 = \frac{9}{2}(1 - L_2 - L_3)L_2(3(1 - L_2 - L_3) - 1) \tag{25}$$

$$N_3 = \frac{9}{2}(1 - L_2 - L_3)L_2(3L_2 - 1) \tag{26}$$

$$N_4 = \frac{1}{2}(3L_2 - 1)(3L_2 - 2)L_2 \tag{27}$$

$$N_5 = \frac{9}{2}L_2L_3(3L_2 - 1) \tag{28}$$

$$N_6 = \frac{9}{2}L_2L_3(3L_3 - 1) \tag{29}$$

$$N_7 = \frac{1}{2}(3L_3 - 1)(3L_3 - 2)L_3 \tag{30}$$

$$N_8 = \frac{9}{2}(1 - L_2 - L_3)L_3(3L_3 - 1) \tag{31}$$

$$N_9 = \frac{9}{2}(1 - L_2 - L_3)L_3(3(1 - L_2 - L_3) - 1) \tag{32}$$

$$N_{10} = 27(1 - L_2 - L_3)L_2L_3 \tag{33}$$

where $L_1$ has been replaced by $1-L_2-L_3$. A model 190C shows nodes 192 through 210 in (u,v) format.

In some embodiments, it may be convenient to rewrite these equations in terms of $U=L_2$ and $V=L_3$, wherein U refers to the parametric value in the U-direction of the element and V refers to the parametric value in the V-direction of the element, such that:

$$N_1 = \frac{1}{2}(2 - 3(U + V))(1 - 3(U + V))(1 - U - V) \tag{34}$$

$$N_2 = \frac{9}{2}(1 - U^2 - UV)(2 - 3(U + V)) \tag{35}$$

$$N_3 = \frac{9}{2}(1 - U^2 - UV)(3U - 1) \tag{36}$$

$$N_4 = \frac{1}{2}(3U^2 - U)(3U - 2) \tag{37}$$

$$N_5 = \frac{9}{2}(3U^2V - UV) \tag{38}$$

$$N_6 = \frac{9}{2}(3UV^2 - UV) \tag{39}$$

$$N_7 = \frac{1}{2}(3V^2 - V)(3V - 2) \tag{40}$$

$$N_8 = \frac{9}{2}(1 - UV - V^2)(3V - 1) \tag{41}$$

$$N_9 = \frac{9}{2}(1 - UV - V^2)(2 - 3(U + V)) \tag{42}$$

$$N_{10} = 27(UV - U^2V - UV^2) \tag{43}$$

The first partials can then be computed as follows:

$$\frac{\partial N_1}{\partial U} = \frac{1}{2}[36(U + V) - 11 - 27(U + V)^2] \tag{44}$$

$$\frac{\partial N_1}{\partial V} = \frac{1}{2}[36(U + V) - 11 - 27(U + V)^2] \tag{45}$$

$$\frac{\partial N_2}{\partial U} = \frac{9}{2}[3(3U + V)(U + V) - 2(2U + V) - 3] \tag{46}$$

$$\frac{\partial N_2}{\partial V} = \frac{9}{2}(6U^2 + 6UV - 2U - 3) \tag{47}$$

-continued $$\frac{\partial N_3}{\partial U} = \frac{9}{2}(3 - 9U^2 - 6UV + 2U + V) \quad (48)$$

$$\frac{\partial N_3}{\partial V} = \frac{9}{2}(1 - 3U)U \quad (49)$$

$$\frac{\partial N_4}{\partial U} = \frac{1}{2}(27U^2 - 18U + 2) \quad (50)$$

$$\frac{\partial N_4}{\partial V} = 0 \quad (51)$$

$$\frac{\partial N_5}{\partial U} = \frac{9}{2}(6U - 1)V \quad (52)$$

$$\frac{\partial N_5}{\partial V} = \frac{9}{2}(3U - 1)U \quad (53)$$

$$\frac{\partial N_6}{\partial U} = \frac{9}{2}(3V - 1)V \quad (54)$$

$$\frac{\partial N_6}{\partial V} = \frac{9}{2}(6V - 1)U \quad (55)$$

$$\frac{\partial N_7}{\partial U} = 0 \quad (56)$$

$$\frac{\partial N_7}{\partial U} = \frac{1}{2}(27V^2 - 18V + 2) \quad (57)$$

$$\frac{\partial N_8}{\partial U} = \frac{9}{2}(1 - 3V)V \quad (58)$$

$$\frac{\partial N_8}{\partial V} = \frac{9}{2}(3 - 9V^2 - 6UV + 2V + U) \quad (59)$$

$$\frac{\partial N_9}{\partial U} = \frac{9}{2}(6V^2 + 6UV - 2V - 3) \quad (60)$$

$$\frac{\partial N_9}{\partial V} = \frac{9}{2}(3(U + 3V)(U + V) - 2(U + 2V) - 3) \quad (61)$$

$$\frac{\partial N_{10}}{\partial U} = 27(1 - 2U - V)V \quad (62)$$

$$\frac{\partial N_{10}}{\partial V} = 27(1 - 2V - U)U \quad (63)$$

Element 130A is used as an example element; however, elements having other shapes, number of nodes, or thickness may also be used. For example, element 190A may be used in combination with element 130A.

Figure 5A:
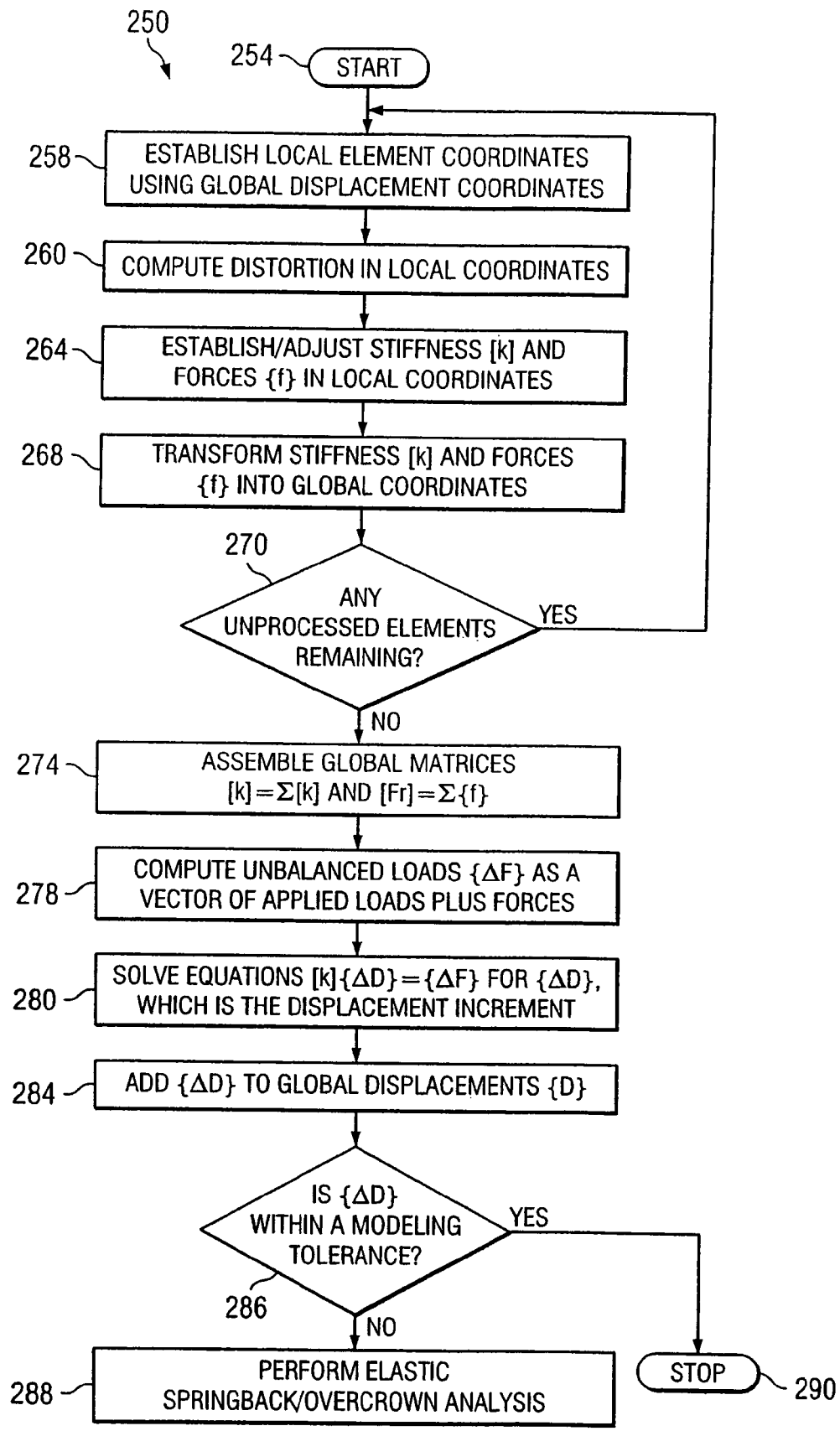
FIG. 5A is a flowchart illustrating the method of finite element analysis according to one embodiment of the present invention.

FIG. 5A is a flowchart illustrating a method 250 of FEA according to one embodiment of the present invention. This method 250 may be performed by finite element software program 38 or through other suitable software or hardware. Method 250 starts at step 254. At step 258, local element coordinates are established by the use of global displacements, referred to herein as the global displacement matrix {D}. Local element coordinates refer to the coordinate systems that are oriented with the local UV-directions of the element and normal vector at any position on element boundary. Global displacements refer to the displacements of all nodes relative to a single "global" coordinate system. Additional details of step 254 are provided below in conjunction with FIG. 5B.

Element displacements, represented by the vector {d}, are computed in local coordinates at step 260 using any suitable mathematical process. The computation of element displacements is based on the global displacements calculated at step 258 and the established local coordinates calculated at step 258.

At a step 264, both a stiffness matrix [k] and forces resulting from the calculated element displacements {f}=–[k]{d} are calculated in local coordinates. Additional details of step 264 are described below in conjunction with FIG. 5C. Transformed versions of these will subsequently be used to determine a next iteration for displacements of nodes 131 based on unbalanced forces on an element 58 resulting from incorrect displacement approximations.

At step 268, the element stiffness matrix [k] and force vector {f} for each element 58 are transformed into global coordinates. At step 270, whether there are any unprocessed elements 130A is determined. If there are any unprocessed elements 130A remaining, then method 250 goes back to step 258. Steps 258 through 268 are repeated for each unprocessed element 130A until it is determined that there are no unprocessed elements at step 270.

After all elements 130A are processed, global stiffness and force matrices, [K]=Σ[k] and [F$_r$]=Σ{f}, respectively, are assembled at step 274. At step 278, the unbalanced loads, represented by force matrix {ΔF} of each node 131 of each element 58 are computed and used as a vector of applied loads plus forces {F$_r$}. Then at step 280, structural equations [K]{ΔD}={ΔF} are solved for displacement increments {ΔD}, where {ΔD} represents the incremental global displacements of each node 131 resulting from unbalanced forces resulting from the estimated global displacement matrix {D}.

At step 284, the displacement increments {ΔD} are added to global displacements {D}. At step 286, the resulting increment displacement of each of nodes 131 is compared with the respective previous displacements of each of nodes 131 to determine whether a convergence has been reached. In one embodiment, a convergence may be reached if the difference between the current and previous displacement of every one of nodes 131 is less than a predetermined modeling tolerance. Modeling tolerances are generally set at a value close to 0. For example, in one embodiment, the modeling tolerance may be set at 0.001 inches; however, any suitable tolerance may be used. If a convergence has not been reached, steps 258 through 286 are repeated. Thus, the following iterative relationship is established:

$$[K]_i\{\Delta D\}_{i+1} = \{F\} - \Sigma[k]_i\{d\}_i \quad (64)$$

$$\{D\}_{i+1} = \{D\}_i + \{\Delta D\}_{i+1} \quad (65)$$

where i refers to the iteration number.

In each iteration of steps 258 through 286, the individual stiffness matrices [k] of each element 130A may be re-evaluated at step 264. Stiffness matrix [k] of element 130A may change depending on the level of displacement of element 58 after each iteration of steps 258 through 286. With increments of displacement, the element stiffness at each Gauss point of element 58 may change due to the amount of effective strain caused by the nodal displacements of the element. For example, the yield stress may be exceeded, causing the stiffness of the material to transition from the elastic to plastic material behavior. By assigning a new stiffness relationship for each Gauss point after an iteration of steps 258 through 286 based on whether the Gauss point is in the elastic or plastic domain, an updated stiffness matrix for each element may be determined by computing the stiffness contribution at each Gauss point of element 58. Alternatively, the new value for the material stiffness could be updated at a frequency less than every iteration. At each iteration of steps 258 through 286, the modulus of elasticity may be updated using the stress-strain relationship of the material, such as the one shown by a graph 70 of FIG. 5B, which is described below. The updating of the modulus of elasticity and the stiffness matrix in some iterations of steps 258 through 286 may also be referred to as "recurrently approximating" or "recurrently updating" the modulus of elasticity and the stiffness matrix.

Updating stiffness matrix [k] for iterations of steps 258 through 286 is advantageous because it compensates for the transition between the elastic and plastic domain of the specified material, an example of which is shown in FIG. 2. Such a compensation results in a more accurate model, even in cases of large increment displacements, without increasing the number of elements in a mesh.

If, at step 286, it is determined that a convergence has been reached, an elastic springback/overcrown analysis may optionally be performed at step 288. Additional details of step 288 are described below. Method 250 concludes at step 240.

Reevaluating and updating stiffness matrix [k] at iterations of step 264 is advantageous because an accurate model of the device may be generated without substantially increasing the number of elements in a given mesh. A relatively small number of elements in a given mesh decreases the required computing power and time.

Figure 5B:
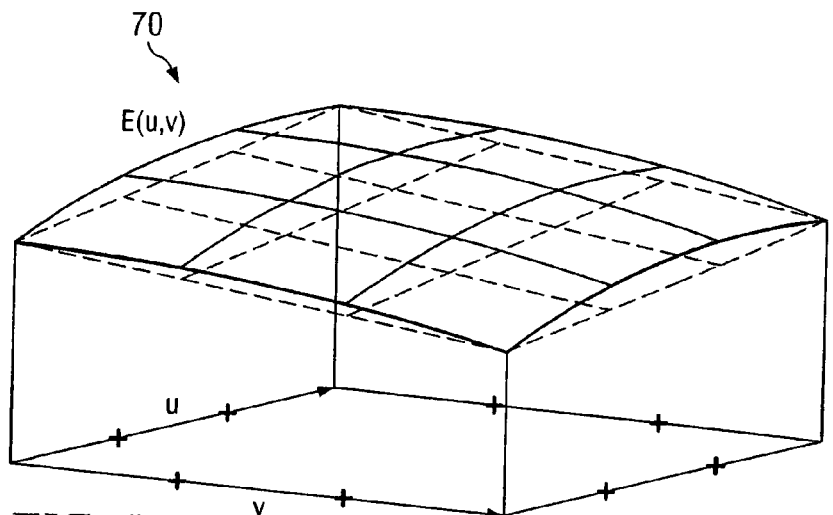
FIG. 5B is a graph illustrating a parabolic approximation of a modulus of elasticity that may be used for performing the method of FIG. 5A.

FIG. 5B is a graph 70 illustrating a parabolic approximation of the modulus of elasticity of an element, such as element 58. In one embodiment, the element has an independent value of modulus of elasticity assigned to each Gauss point 64 (shown in FIGS. 1A and 1B). Prior to a displacement of the element, the distribution of the magnitude of the modulus of elasticity at each Gauss point 64 is illustrated as flat and planar, as shown by the dotted portion of graph 70 that is flat. After the element is displaced by an increment, the material properties, such as a modulus of elasticity, of each Gauss point 64 may also change. To account for the changes in material properties caused by incremental displacement of each element 58, the modulus of elasticity of each Gauss point 64 is updated after the displacement. The magnitude of the updated values indicating the modulus of elasticity are graphically illustrated as a parabolic plane, as shown by the shaded parabolic plane of graph 70 that overlies the dotted plane. The parabolic plane of graph 70 also illustrates the stiffness contribution at each Gauss point 64, which is mathematically modeled to evaluate the stiffness matrix [k] described above.

In some embodiments where a mesh is applied over a material that defines an empty space, such as a hole, the value of modulus of elasticity may be artificially reduced to model the hole. For example, if sheet metal having a hole is used as the example material, the modulus of elasticity may be defined as $29 \times 10^6$ psi for Gauss point 64 that is far from the hole. However, the modulus of elasticity may be defined as 10 psi for Gauss point 64 that is close to the hole.

As described above, the elastic modulus represents the relationship between stress and strain, such that $\sigma = E\epsilon$. E refers to elastic modulus, which is a value that represents a ratio of stress and strain in the elastic domain; $\sigma$ refers to stress, and $\epsilon$ refers to strain. $\sigma = E\epsilon$ is a valid condition for values of strain that remain below the proportional limit of strain ($\epsilon_{PL}$). The elastic modulus across the domain of an element may be evaluated using a parabolic approximation, an example of which is illustrated as graph 70, such that:

$$E_{(U,V)} = \sum_{i=1}^{4} (N_i)_{(U,V)} E_i \quad (66)$$

where $$N_i = \frac{(1 \pm U)(1 \pm V)}{4} \quad (67)$$

where
  $N_i$=Shape function associated with node i,
  $E_i$=Modulus of elasticity at node i,
  U=Parametric value in U-direction of element,
  V=Parametric value in V-direction of element, and
  $E_{(U,V)}$=Interpolated value for modulus of elasticity at parametric UV-position of element.

Adjusting the respective values of the modulus of elasticity for each Gauss point of an element in each iteration of a FEA method is advantageous because an accurate model of the device may be generated without substantially increasing the number of elements in a given mesh. A relatively small number of elements in a given mesh decreases the required computing power and time.

Figure 5C:
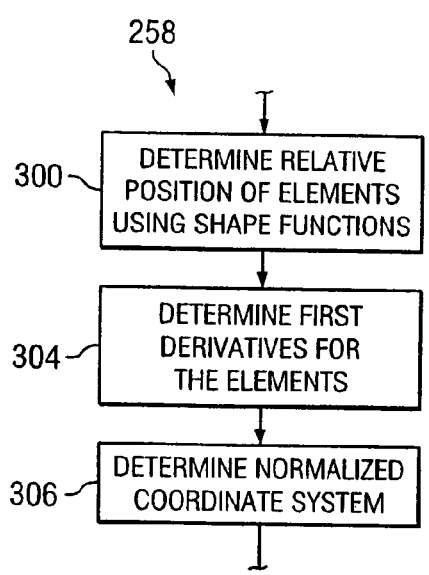
FIG. 5C is a flowchart illustrating additional details of a step shown in the method of FIG. 5A.

FIG. 5C illustrates additional details of one embodiment of step 258 of establishing local element coordinates using a global displacement matrix {D}. At step 300, using the shape functions (Equations 5 through 63) for elements 130A and/or 190A, the initial estimate of the relative position, which is the same as the global displacement matrix {D} with respect to the parametric UV-space (an example of the parametric UV space parameters are $-1.0 <= u <= 1.0$ and $-1.0 <= v <= 1.0$) of these elements 130A and/or 190A is evaluated based on the imposed boundary conditions as:

$$S = \{x \ y \ z\}_{(U,V)} = \sum_{i=1}^{n} (N_i)_{(U,V)} \{x_i \ y_i \ z_i\} \quad (68)$$

where
  S=Vector defining position at uv-parameter of element,
  x=x-coordinate of position vector S,
  y=y-coordinate of position vector S,
  z=z-coordinate of position vector S,
  u=Parameter value of element in U-direction, and
  v=Parameter value of element in V-direction.

The boundary conditions are imposed by using the "Penalty Method" for each constrained degree-of-freedom. At step 304, the first spatial derivatives for each element 130A or 190A are evaluated in order to determine a normalized local coordinate system. The first spatial derivatives for each element 130A or 190A are evaluated as:

$$\begin{bmatrix} \frac{\partial S}{\partial U} \\ \frac{\partial S}{\partial V} \end{bmatrix}_{(U,V)} = \begin{bmatrix} \frac{\partial x}{\partial U} & \frac{\partial y}{\partial U} & \frac{\partial z}{\partial U} \\ \frac{\partial x}{\partial V} & \frac{\partial y}{\partial V} & \frac{\partial z}{\partial V} \end{bmatrix}_{(U,V)} \quad (69)$$

$$= \sum_{i=1}^{n} \begin{Bmatrix} \frac{\partial N_i}{\partial U} \\ \frac{\partial N_i}{\partial V} \end{Bmatrix}_{(U,V)} \{x_i \ y_i \ z_i\}$$

Using the first derivatives determined at step 304, a normalized coordinate system having unit vectors $e_1$, $e_2$, and $e_3$ with respect to the given UV-parameters is computed at step 306 as follows:

$$e_3 = \begin{Bmatrix} l_3 \\ m_3 \\ n_3 \end{Bmatrix} = \left( \frac{\frac{\partial S}{\partial U} \times \frac{\partial S}{\partial V}}{\left| \frac{\partial S}{\partial U} \times \frac{\partial S}{\partial V} \right|} \right)_{(U,V)} \quad (70)$$

$$e_2 = \begin{Bmatrix} l_2 \\ m_2 \\ n_2 \end{Bmatrix} = \left( \frac{e_3 \times \frac{\partial S}{\partial U}}{\left| e_3 \times \frac{\partial S}{\partial U} \right|} \right)_{(U,V)}$$

$$e_1 = \begin{Bmatrix} l_1 \\ m_1 \\ n_1 \end{Bmatrix} = e_2 \times e_3$$

where
e=coordinate vector for local coordinate system,
l=local x-component of coordinate vector e,
m=local y-component of coordinate vector e, and
n=local z-component of coordinate vector e.

The resulting global displacement matrix $\{D\}$ is expressed as:

$$\{D\} = \{e_1 \ e_2 \ e_3\}_{(U,V)} = \begin{bmatrix} l_1 & l_2 & l_3 \\ m_1 & m_2 & m_3 \\ n_1 & n_2 & n_3 \end{bmatrix}_{(U,V)} \quad (71)$$

Figure 5D:
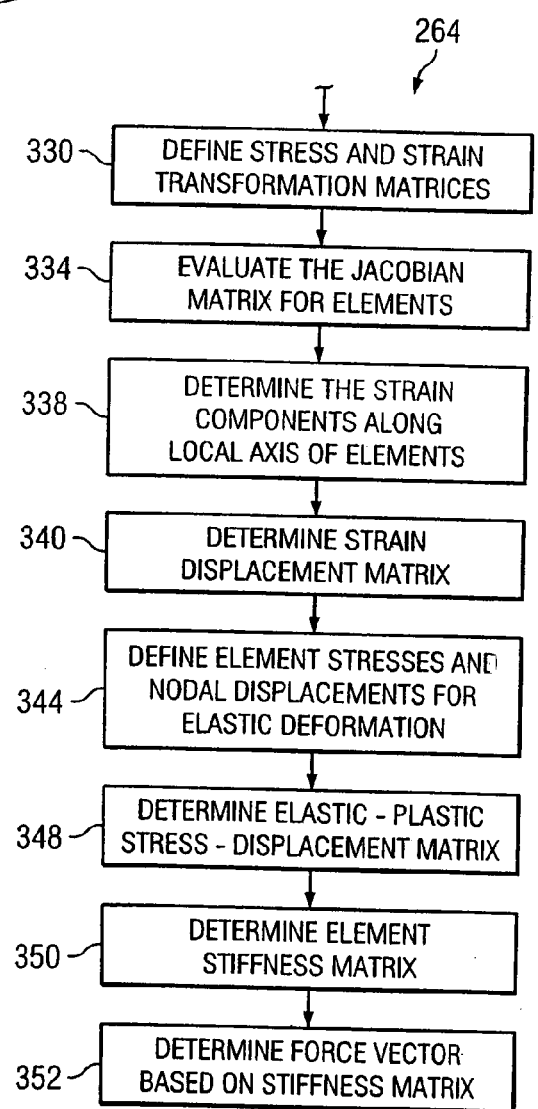
FIG. 5D is a flowchart illustrating additional details of a step shown in the method of FIG. 5A.

FIG. 5D illustrates additional details of one embodiment of step 264 of establishing/adjusting stiffness matrix [k], representing the element stiffness matrix in local coordinates, and force vector {f}, representing element forces in local coordinates. Force vector {f} is determined based on the computed stiffness matrix [k] and the local nodal displacement. Stiffness matrix [k] is determined by numerical integration using the strain-displacement matrix, the elastic and elastic-plastic stress-displacement matrix, and the Jacobian matrix. The strain-displacement matrix defines the relationship between the displacements and strains for each element. The stress-displacement matrix defines the relationship between element strain and stress. The determination of the Jacobian matrix is required for the numerical integration of each element. Details of this procedure are described below with reference to FIG. 5D.

At step 330, the stress and strain transformation matrices for elements 130A and 190A may be defined respectively as:

$$T_\sigma = \begin{bmatrix} T_{11} & 2T_{12} \\ T_{21} & T_{22} \end{bmatrix}_{(U,V)} \quad (72)$$

$$T_\varepsilon = \begin{bmatrix} T_{11} & T_{12} \\ 2T_{21} & T_{22} \end{bmatrix}_{(U,V)}$$

where
$T_\sigma$=Stress transformation matrix,
$T_\varepsilon$=Strain transformation matrix,
$T_{11}$=Upper-left quadrant submatrix,
$T_{12}$=Upper-right quadrant submatrix,
$T_{21}$=Lower-left quadrant submatrix, and
$T_{22}$=Lower-right quadrant submatrix.

where each submatrix is defined as:

$$T_{11} = \begin{bmatrix} l_1^2 & m_1^2 & n_1^2 \\ l_2^2 & m_2^2 & n_2^2 \\ l_3^2 & m_3^2 & n_3^2 \end{bmatrix}_{(U,V)} \quad T_{12} = \begin{bmatrix} l_1 m_1 & m_1 n_1 & n_1 l_1 \\ l_2 m_2 & m_2 n_2 & n_2 l_2 \\ l_3 m_3 & m_3 n_3 & n_3 l_3 \end{bmatrix}_{(U,V)} \quad (73)$$

$$T_{21} = \begin{bmatrix} l_1 l_2 & m_1 m_2 & n_1 n_2 \\ l_2 l_3 & m_2 m_3 & n_2 n_3 \\ l_3 l_1 & m_3 m_1 & n_3 n_1 \end{bmatrix}_{(U,V)}$$

$$T_{22} = \begin{bmatrix} l_1 m_2 + l_2 m_1 & m_1 n_2 + m_2 n_1 & n_1 l_2 + n_2 l_1 \\ l_2 m_3 + l_3 m_2 & m_2 n_3 + m_3 n_2 & n_2 l_3 + n_3 l_2 \\ l_3 m_1 + l_1 m_3 & m_3 n_1 + m_1 n_3 & n_3 l_1 + n_1 l_3 \end{bmatrix}_{(U,V)}$$

For each of these stress and strain transformation matrices, it can also be shown that their inverse is equal to their transpose, such that:

$$T_\sigma^{-1} = T_\sigma^T \quad T_\varepsilon^{-1} = T_\varepsilon^T \quad (74)$$

At step 334, the Jacobian matrix for shell elements 130A and 190A is evaluated as follows:

$$J = \sum_{i=1}^{n} \begin{bmatrix} (x_i + x_i^*)\left(\frac{\partial N_i}{\partial U}\right) & (y_i + y_i^*)\left(\frac{\partial N_i}{\partial U}\right) & (z_i + z_i^*)\left(\frac{\partial N_i}{\partial U}\right) \\ (x_i + x_i^*)\left(\frac{\partial N_i}{\partial V}\right) & (y_i + y_i^*)\left(\frac{\partial N_i}{\partial V}\right) & (z_i + z_i^*)\left(\frac{\partial N_i}{\partial V}\right) \\ x_i^* N_i & y_i^* N_i & z_i^* N_i \end{bmatrix}_{(U,V,W)} \quad (75)$$

where
$x_i^*$=Magnitude of X-component along normal direction of element,
$y_i^*$=Magnitude of Y-component along normal direction of element, and
$z_i^*$=Magnitude of Z-component along normal direction of element.

where $V_i^*$ is defined as:

$$V_i^* = \begin{Bmatrix} x_i^* \\ y_i^* \\ z_i^* \end{Bmatrix}_{(W)} = \frac{W \cdot t_i}{2} \begin{Bmatrix} l_3 \\ m_3 \\ n_3 \end{Bmatrix}_i \quad (76)$$

where
w=Parametric value along thickness direction of element (−1.0<=w<=1.0), and
$t_i$=Thickness of element.

And the inverse Jacobian is then defined as:

$$J^{-1} = \begin{bmatrix} J_{11}^* & J_{12}^* & J_{13}^* \\ J_{21}^* & J_{22}^* & J_{23}^* \\ J_{31}^* & J_{32}^* & J_{33}^* \end{bmatrix}_{(U,V,W)} \quad (77)$$

where
j*=Inverted indices of Jacobian matrix.

At step 338, assuming $\epsilon'_z=0$, the strain components along the local axis of elements 130A and 190A are given by the following:

$$\begin{Bmatrix} \varepsilon_{x'} \\ \varepsilon_{y'} \\ \gamma_{x'y'} \\ \gamma_{x'z'} \\ \gamma_{y'z'} \end{Bmatrix} = \begin{Bmatrix} \frac{\partial u'}{\partial x'} \\ \frac{\partial v'}{\partial y'} \\ \frac{\partial u'}{\partial y'} + \frac{\partial v'}{\partial x'} \\ \frac{\partial u'}{\partial z'} + \frac{\partial w'}{\partial x'} \\ \frac{\partial v'}{\partial z'} + \frac{\partial w'}{\partial y'} \end{Bmatrix} \tag{78}$$

where $\epsilon_{x'}$=strain in principle x-direction, $\epsilon_{y'}$=strain in principle y-direction, $\gamma_{x'y'}$=shear in principle xy-plane, $\gamma_{x'z'}$=shear in principle xz-plane (bending), and $\gamma_{y'z'}$=shear in principle yz-plane (bending).

The above equation can be written in terms of membrane and bending components, such that:

$$\{\varepsilon\} = \begin{Bmatrix} \{\varepsilon_m\} \\ \{\varepsilon_s\} \end{Bmatrix} \tag{79}$$

where $$\{\varepsilon_m\} = \begin{Bmatrix} \varepsilon_{x'} \\ \varepsilon_{y'} \\ \gamma_{x'y'} \end{Bmatrix} = \begin{Bmatrix} \frac{\partial u'}{\partial x'} \\ \frac{\partial v'}{\partial y'} \\ \frac{\partial u'}{\partial y'} + \frac{\partial v'}{\partial x'} \end{Bmatrix} \tag{80}$$

$$\{\varepsilon_s\} = \begin{Bmatrix} \gamma_{x'z'} \\ \gamma_{y'z'} \end{Bmatrix} = \begin{Bmatrix} \frac{\partial u'}{\partial z'} + \frac{\partial w'}{\partial x'} \\ \frac{\partial v'}{\partial z'} + \frac{\partial w'}{\partial y'} \end{Bmatrix}$$

where $\epsilon_m$=Membrane components of strain, and $\epsilon_s$=Bending components of strain.

At step 340, a strain displacement matrix for each element is determined using the following mathematical process. In global coordinates, the following relationship may be established for computing the element strains:

$$\{\varepsilon\}=[B]\{d\} \tag{81}$$

The strain displacement matrix, [B], is given by [B$_1$ B$_2$ ... B$_n$] where B$_i$ is defined as:

$$B_i = \begin{bmatrix} a_i & 0 & 0 & -d_i l_{2i} & d_i l_{1i} \\ 0 & b_i & 0 & -e_i m_{2i} & e_i m_{1i} \\ 0 & 0 & c_i & -f_i n_{2i} & f_i n_{1i} \\ b_i & a_i & 0_i & -e_i l_{2i} - d_i m_{2i} & e_i l_{1i} + d_i m_{1i} \\ 0 & c_i & b_i & -f_i m_{2i} - e_i n_{2i} & f_i m_{1i} + e_i n_{1i} \\ c_i & 0 & a_i & -d_i n_{2i} - f_i l_{2i} & d_i n_{1i} + f_i l_{1i} \end{bmatrix} \tag{82}$$

where $$a_i = J_{11}^* \frac{\partial N_i}{\partial U} + J_{12}^* \frac{\partial N_i}{\partial V} \quad d_i = \frac{t_i}{2}(a_i W + J_{13}^* N_i) \tag{83}$$

$$b_i = J_{21}^* \frac{\partial N_i}{\partial U} + J_{22}^* \frac{\partial N_i}{\partial V} \quad e_i = \frac{t_i}{2}(b_i W + J_{23}^* N_i) \tag{84}$$

$$c_i = J_{31}^* \frac{\partial N_i}{\partial U} + J_{32}^* \frac{\partial N_i}{\partial V} \quad f_i = \frac{t_i}{2}(c_i W + J_{33}^* N_i) \tag{85}$$

In local coordinates, this strain-displacement matrix may be written as:

$$B'=T_e B \tag{86}$$

At step 344, the element stresses and nodal displacements during elastic deformation may be related by:

$$\{\sigma\}=[C][B]\{d\}=[CB]\{d\} \tag{87}$$

where [C]=Constitutive matrix.

Assuming $\sigma_z=0$, the following is obtained for the stress-strain relation in x',y',z' coordinates. The x',y',z' represents the local coordinate directions of an element:

$$\{\sigma'\}=[C]\{\epsilon'\} \tag{88}$$

Such that, $$\begin{Bmatrix} \sigma_{x'} \\ \sigma_{y'} \\ \tau_{x'y'} \\ \tau_{y'z'} \\ \tau_{z'x'} \end{Bmatrix} = \frac{E}{1-\mu^2} \begin{bmatrix} 1 & \mu & 0 & 0 & 0 \\ \mu & 1 & 0 & 0 & 0 \\ 0 & 0 & \frac{1-\mu}{2} & 0 & 0 \\ 0 & 0 & 0 & \frac{\alpha(1-\mu)}{2} & 0 \\ 0 & 0 & 0 & 0 & \frac{\alpha(1-\mu)}{2} \end{bmatrix} \cdot \begin{Bmatrix} \varepsilon_{x'} \\ \varepsilon_{y'} \\ \gamma_{x'y'} \\ \gamma_{y'z'} \\ \gamma_{z'x'} \end{Bmatrix} \tag{89}$$

where $\sigma_{x'}$=Stress in principle x-direction, $\sigma_{y'}$=Stress in principle y-direction, $\tau_{x'y'}$=Shear-stress in principle xy-plane, $\tau_{y'z'}$=Bending-stress in principle yz-plane, $\tau_{z'x'}$=Bending-stress in principle zx-plane, and $\mu$=Poison's ratio.

When a deformable body is subjected to an axial tensile force, not only does it elongate but it may also contracts laterally. Likewise, an axial compressive force acting on a body causes it to contract in the direction of the force and its sides expand laterally. The proportional ratio of these strains is referred to as Poisson's ratio ($\mu$), such that for an isotropic material we have:

$$\mu = \frac{\varepsilon_{lat}}{\varepsilon_{long}} \quad (90)$$

However, it may be necessary to consider an anisotropic relationship between the value for Poisson's ratio that is applied in the tangential directions of the element and the normal direction of the element. This normal anisotropic ratio, or r-factor, will be imposed such that:

$$r = \frac{\mu_T}{\mu_N} \quad (91)$$

where
$\mu_T$=Poisson's ratio in membrane direction, and
$\mu_N$=Poisson's ratio in thickness direction.

For an isotropic r-value, (r=1.0), and considering a true volume-preserving condition, the value for Poisson's ratio becomes:

$$\mu = 1 - \frac{1}{\sqrt{2}} \approx 0.29289 \quad (92)$$

Thus, for a given isotropic value for Poisson's ratio, the following relationship may be used to compute equivalent anisotropic values based on the r-value provided, such that the following relationship is obtained:

$$(1-\mu)^2 = (1-\mu_N)(1-\mu_T) = (1-\mu_N)(1-r\mu_N) \quad (93)$$

Solving this quadratic equation for $\mu_N$ and $\mu_T$ results in:

$$\mu_N = \frac{1 - \sqrt{4(-1+(1-\mu)^2)\cdot r + (1+r)^2} + r}{2r} \quad (94)$$

$$\mu_T = r \cdot \mu_N$$

Thus, when defining the constitutive matrix of each element, the value for Poisson's ratio in the tangential direction, $\mu_T$, is used.

Using equation 89 and equation 94, the stress-displacement matrix may be divided into membrane and bending components, such that:

$$C = \begin{bmatrix} C_m & 0 \\ 0 & C_s \end{bmatrix} \quad (95)$$

where $$C_m = \frac{E_{(U,V)}}{1-\mu_T^2} \begin{bmatrix} 1 & \mu_T & 0 \\ \mu_T & 1 & 0 \\ 0 & 0 & \frac{1-\mu_T}{2} \end{bmatrix} \quad (96)$$

$$C_s = \frac{E_{(U,V)}}{2(1+\mu_T)} \begin{bmatrix} \alpha & 0 \\ 0 & \alpha \end{bmatrix} \alpha = \frac{5}{6}$$

where
$C_m$=Constitutive matrix for membrane components of stress-strain relationship, and
$C_s$=Constitutive matrix for bending components of stress-strain relationship.

At step 348, an elastic-plastic stress displacement matrix may be evaluated as follows: Yielding begins under any state of stress when the effective stress ($\bar{\sigma}$) exceeds the yield stress ($\sigma_y$). As the effective plastic strain ($\bar{\epsilon}^P$) grows, the value of effective stress ($\bar{\sigma}$) that must be exceeded to produce further yield also grows. This is most commonly known as the strain-hardening phenomenon. If unloading occurs, it may be assumed that no matter what the subsequent state of stress, yielding resumes only when ($\bar{\sigma}$) exceeds its previous maximum value. This effective stress ($\bar{\sigma}$), according to the Von Mises criterion, can be computed as:

$$\bar{\sigma} = \frac{1}{\sqrt{2}}[(\sigma_x)^2 + (\sigma_y)^2 + (\sigma_x - \sigma_y)^2 + 6(\tau_{xy}^2 + \tau_{yz}^2 + \tau_{zx}^2)]^{1/2} \quad (97)$$

The effective plastic strain increment ($d\bar{\epsilon}^P$) is defined as a combination of the separate plastic strain increments, such that:

$$d\bar{\epsilon}^P = \frac{\sqrt{2}}{3}\left[(d\varepsilon_x^P)^2 + (d\varepsilon_y^P)^2 + (d\varepsilon_x^P - d\varepsilon_y^P)^2 + \frac{3}{2}(d\gamma_{xy}^P)^2 + \frac{3}{2}(d\gamma_{yz}^P)^2 + \frac{3}{2}(d\gamma_{zx}^P)^2\right]^{1/2} \quad (98)$$

where P refers to the plastic-component of strain.

Differentiating both sides of the equation for effective stress ($\bar{\sigma}$), ($d\bar{\sigma}$) is computed as:

$$d\bar{\sigma} = \left\{\frac{\partial \bar{\sigma}}{\partial \sigma}\right\}^T \{d\sigma_x \; d\sigma_y \; d\tau_{xy} \; d\tau_{yz} \; d\tau_{zx}\} \quad (99)$$

where, $$\left\{\frac{\partial \bar{\sigma}}{\partial \sigma}\right\} = \left\{\frac{3\sigma_x'}{2\bar{\sigma}} \; \frac{3\sigma_y'}{2\bar{\sigma}} \; \frac{3\tau_{xy}}{\bar{\sigma}} \; \frac{3\tau_{yz}}{\bar{\sigma}} \; \frac{3\tau_{zx}}{\bar{\sigma}}\right\} \quad (100)$$

and $$\sigma_x' = \frac{2\sigma_x - \sigma_y}{3} \quad (101)$$

$$\sigma_y' = \frac{2\sigma_y - \sigma_x}{3}$$

From the Prandtl-Reuss relationship, the plastic strain increment may be defined by:

$$\{d\varepsilon^P\} = \{d\varepsilon_x^P \; d\varepsilon_y^P \; d\gamma_{xy}^P \; d\gamma_{yz}^P \; d\gamma_{zx}^P\} = \left\{\frac{\partial \bar{\sigma}}{\partial \sigma}\right\} d\bar{\varepsilon}^P \quad (102)$$

Because a strain increment (d$\epsilon$) is the sum of its elastic component (d$\epsilon^e$) and its plastic component (d$\epsilon^P$):

$$\{d\sigma\} = [C]\{d\epsilon^e\} = [C](\{d\epsilon\} - \{d\epsilon^P\}) \quad (103)$$

A relation that yields the plastic strain increment ($d\bar{\epsilon}^P$) from the total strain increment $\{d\epsilon\}$ is obtained by substituting the above stated equations for $\sigma'_x$ and $\sigma'_y$ into the above stated equation for $\{d\epsilon^p\}$ and multiplying by $\{\partial\bar{\sigma}/\partial\sigma\}^T$. Such manipulations result in:

$$\left\{\frac{\partial\bar{\sigma}}{\partial\sigma}\right\}^T\{d\sigma\} = \left\{\frac{\partial\bar{\sigma}}{\partial\sigma}\right\}^T[C]\left(\{d\varepsilon\} - \left\{\frac{\partial\bar{\sigma}}{\partial\sigma}\right\}d\bar{\varepsilon}^p\right) \quad (104)$$

where T denotes the transpose of a vector.

Substituting the relationship, $\{\partial\bar{\sigma}/\partial\sigma\}^T\{d\sigma\}=H'd\bar{\epsilon}^p$ into the above stated equation for $\{d\epsilon^p\}$, the plastic strain increment ($d\bar{\epsilon}^p$) may be written in terms of the total strain increment $\{d\epsilon\}$ as:

$$d\bar{\varepsilon}^p = \frac{\left\{\frac{\partial\bar{\sigma}}{\partial\sigma}\right\}^T[C]}{H' + \left\{\frac{\partial\bar{\sigma}}{\partial\sigma}\right\}^T[C]\left\{\frac{\partial\bar{\sigma}}{\partial\sigma}\right\}}\{d\varepsilon\} = [W]\{d\varepsilon\} \quad (105)$$

where [W]=Tensor to compute plastic strain increment in terms of total strain increment.

Substitution of the equation for plastic strain increment $d\bar{\epsilon}^p$ into the above stated equation for $\{d\epsilon^p\}$, and substituting this result into the above stated equation for incremental stress $\{d\sigma\}$ results in an incremental stress-strain relationship that is valid beyond the proportional limit (for example, beyond yield stress), such that:

$$\{d\sigma\} = \left([C] - [C]\left\{\frac{\partial\bar{\sigma}}{\partial\sigma}\right\}[W]\right)\{d\varepsilon\} = [C_{ep}]\{d\varepsilon\} \quad (106)$$

After obtaining the [B] matrix and [CB] matrix in the local coordinates x',y',z', these matrices may be used to compute the element stiffness matrix at step 350. The transformation of this matrix is derived based on the concept that during any virtual displacement, the resulting increment in strain energy density must be the same regardless of the coordinate system in which it is computed. Thus, the stiffness matrix is given by:

$$k = \int_{-1}^{+1}\int_{-1}^{+1}\int_{-1}^{+1} B^T CB|J|\,du\,dv\,dw \quad (107)$$

where $B^T$=Transpose of strain-displacement matrix.

In one embodiment, for quadrilateral shell element 130A, integration may be performed using the Gauss-Legendre Quadrature technique with a 3×3×2 ordering using the following Gauss points and weights:

| Order | Points | Weights |
|---|---|---|
| 2 | ±0.577350269 | +1.00000000 |
| 3 | 0.000000000 | +0.88888889 |
|   | ±0.774596669 | +0.55555556 |

$$k = \sum_{c=1}^{2}\sum_{b=1}^{3}\sum_{a=1}^{3}(W_3)_a(W_3)_b(W_2)_c[B]^T_{(u_a,v_b,w_c)}[CB]_{(u_a,v_b,w_c)}|J|_{(u_a,v_b,w_c)} \quad (108)$$

In one embodiment, for the triangular shell element 190A, integration may be performed using the following Gauss points and weights:

| Order | Points | | Weights |
|---|---|---|---|
| 2 | +0.577350269 | | +1.00000000 |
|   | u | v | |
| 3 | 0.33333333 | 0.33333333 | 0.56250000 |
|   | 0.60000000 | 0.20000000 | 0.52083333 |
|   | 0.20000000 | 0.20000000 | 0.52083333 |
|   | 0.20000000 | 0.60000000 | 0.52083333 |

$$k = \frac{1}{2}\sum_{b}^{2}\sum_{a}^{4}(W_3)_a(W_2)_b[B]^T_{(u_a,v_a,w_b)}[CB]_{(u_a,v_a,w_b)}|J|_{(u_a,v_a,w_b)} \quad (109)$$

Then at step 352, the force vector $\{f\}$ is determined based on the stiffness matrix [k], using the equation $\{f\}=-[k]\{d\}$.

In one embodiment, after performing the initial plastic deformation analysis of region 54, an optional springback and/or overcrown analysis may be performed at step 288 of method 250. A springback analysis refers to an analysis of the shape of material after the previously applied boundary conditions are removed and the material assumes it relaxed or natural state. Overcrown analysis refers to an estimate on the amount of over-shaping of a material that is required so that the springback shape equals the desired shape of the material. Springback/overcrown analysis accounts for the accumulation of internal stresses that are developed for the forming operations of a material. Springback/overcrown analysis may be performed using a static analysis based on the stiffness matrix that is assembled from the unformed part. The nodal forces that may be applied to the model may be determined from the inverse of the modified global stiffness matrix that was obtained during the initial forming operation that is described in method 250, such that:

$$\{F\}=[K_I]^{-1}\{D_P\} \quad (110)$$

and $$[K_F]\{F\}=\{D_S\} \quad (111)$$

where
   $\{F\}$=The resultant internal loads vector computed from the inverse of the modified global stiffness matrix and the resultant displacements of the initial forming analysis.
   $[K_I]^{-1}$=The inverse of the modified global stiffness matrix.
   $[K_F]$=The stiffness matrix computed from the resultant displaced nodal coordinates from the initial forming analysis
   $\{D_P\}$=The resultant displacement vector computed from the initial forming analysis.
   $\{D_S\}$=The springback displacement vector computed from a post linear static analysis.

This approach assumes that the overcrowned shape may be reasonably approximated by applying nodal loads that are based on the direct opposite of the stresses that are required to induce an elastic-springback shape of the shaped material.

Although the present invention has been described in detail, it should be understood that various changes, substitutions, and alterations can be made hereto without departing from the spirit and scope of the invention as defined by the appended claims.

What is claimed is:

1. A computerized method for determining deformation of a surface of a material, comprising:

receiving, at a computer, an elastic deformation range and a plastic deformation range of the material;

modeling a region of the material with a mesh comprising a plurality of elements;

determining, by performing a finite element analysis on the mesh by the computer, a displacement for at least one point on each of the elements, the displacement resulting from a set of modeled boundary conditions, the finite element analysis including recurrently approximating the modulus of elasticity for each element according to the elastic deformation range and the plastic deformation range based on a value of strain calculated from a previously calculated element displacement.

2. The method of claim 1, wherein the each of the plurality of elements comprises at least one node and performing the finite element analysis comprises determining that a displacement of each of the at least one node is within a predetermined modeling tolerance.

3. The method of claim 1, wherein performing the finite element analysis comprises determining, for the each of the plurality of elements, a stiffness matrix and at least one force vector based on the modules of elasticity, the stiffness matrix and the at least one force vector in a local coordinate system format that is local to the each of the plurality of elements.

4. The method of claim 1, wherein performing the finite element analysis comprises determining, for the each of the plurality of elements, a stiffness matrix and at least one force vector based on the modules of elasticity, the stiffness matrix and the at least one force vector in a local coordinate system format that is local to the each of the plurality of elements, and further comprising transforming the stiffness matrix and the at least one force vector into a global coordinate system format that is used for all of the plurality of elements.

5. The method of claim 1, wherein performing the finite element analysis comprises determining, after converging on a solution, a global stiffness matrix from a sum of a plurality of respective stiffness matrices of the plurality of elements, and further comprising, for the each of the plurality of elements, determining a springback position by calculating the inverse of the global stiffness matrix.

6. The method of claim 1, wherein at least one of the plurality of elements is a quadrilateral, and further comprising designating at least twelve nodes along the nodal lines of the quadrilateral, wherein four of the at least twelve nodes are respectively disposed on the four corners of the quadrilateral.

7. The method of claim 1, wherein at least one of the plurality of elements is a triangular geometry, and further comprising designating at least ten nodes for the triangular geometry, wherein three of the at least ten nodes are respectively disposed on the three corners of the triangular geometry and at least one of the at least ten nodes are disposed at the approximate center of the triangular geometry.

8. The method of claim 1, wherein modeling a region of the material with a mesh comprises providing the mesh using the technique of parasolid faceting.

9. The method of claim 1, wherein receiving the elastic deformation range and the plastic deformation range comprises receiving the elastic deformation range that transitions into the plastic deformation range at a point associated with the yield stress of the material, and wherein recurrently approximating the modulus of elasticity for each element comprises determining that the value of strain calculated from the previously calculated element displacement has reached the point of yield stress and in response, determining that the modulus of elasticity is in the plastic deformation range.

10. The method of claim 1, wherein approximating the modulus of elasticity comprises using the effective stress imposed on the element, the effective stress calculated using the Von Mises criterion.

11. A method of finite element analysis comprising:

receiving, at a computer, an elastic deformation range and a plastic deformation range of a material, the elastic deformation range transitioning into the plastic deformation range at a point associated with the yield stress of the material;

modeling the material with a mesh comprising a plurality of elements, each of the plurality of elements comprising a plurality of nodes;

for each of a plurality of iterations of the finite element analysis, calculating a stiffness matrix for the each of the plurality of elements, wherein the stiffness matrix is calculated using a modulus of elasticity according to the elastic deformation range when a value of strain calculated from a previously determined element displacement is below the point associated with the yield stress and according to the plastic deformation range when the value of strain is equal to or above the point; and after calculating the stiffness matrix for the each of the plurality of elements, determining that a displacement of the each of the plurality of nodes is within a predetermined modeling tolerance.

12. The method of claim 11, wherein each of the plurality of elements comprises at least one Gauss point, and wherein calculating a stiffness matrix comprises assigning an updated modulus of elasticity for each of a plurality of Gauss points, the updated modulus of elasticity determined according to a change in a value of strain of the each of the plurality of elements, the change of the value calculated from an incremental displacement of the each of the plurality of elements from a previous iteration of the finite element analysis.

13. The method of claim 11, and further comprising approximating each of the elastic deformation range and the plastic deformation range as a linear relationship of stress and strain.

14. The method of claim 11, wherein calculating the stiffness matrix further comprises converting the format of the stiffness matrix into a new format using a global coordinate system that is operable to be consistently applied for all of the plurality of elements.

15. The method of claim 11, and further comprising:

calculating at least one force vector associated with the each of the plurality of elements using the respective stiffness matrices of the plurality of elements, the at least one force vector and the stiffness matrix of the each of the plurality of elements in a respective local coordinate system; and transforming the stiffness matrix and the at least one force vector of the each of the elements into a global coordinate system format that is used for all of the plurality of elements.

16. The method of claim 11, wherein performing the finite element analysis comprises determining a global stiffness matrix from a sum of a plurality of the respective stiffness matrices of the plurality of elements after converging on a solution, and further comprising, for the each of the plurality of elements, determining a springback position by calculating the inverse of the global stiffness matrix.

23

17. The method of claim 11, wherein at least one of the plurality of elements is a quadrilateral, and further comprising designating at least twelve nodes along the nodal lines of the quadrilateral, wherein four of the at least twelve nodes are respectively disposed on the four corners of the quadrilateral.

18. The method of claim 11, wherein at least one of the plurality of elements is a triangular geometry, and further comprising designating at least ten nodes for the triangular geometry, wherein three of the at least ten nodes are respectively disposed on the three corners of the triangular geometry and at least one of the at least ten nodes are disposed at the approximate center of the triangular geometry.

19. The method of claim 11, wherein modeling the material with a mesh comprises providing the mesh using a technique of parasolid faceting.

20. The method of claim 11, wherein calculating a stiffness matrix comprises approximately the modulus of elasticity based on the effective stress imposed on the element, the effective stress calculated using the Von Mises criterion.

21. An apparatus for modeling displacement of a material, comprising:
  a software program stored on a computer readable medium and operable, when executed on a processor, to:
    receive an elastic deformation range and a plastic deformation range of the material;
    model a region of the material with a mesh comprising a plurality of elements; and
    determine, by performing a finite element analysis on the mesh by the computer, a displacement for at least one point on each of the elements, the displacement resulting from a set of modeled boundary conditions, the finite element analysis including recurrently approximating the modulus of elasticity for each element according to the elastic deformation range and the plastic deformation range based on a value of strain calculated from a previously calculated element displacement.

22. The apparatus of claim 21, wherein the each of the plurality of elements comprises at least one node and performing the finite element analysis comprises determining that a displacement of each of the at least one node is within a predetermined modeling tolerance.

23. The apparatus of claim 21, wherein the software program is operable to perform the finite element analysis by determining, for the each of the plurality of elements, a stiffness matrix and at least one force vector based on the modules of elasticity, the stiffness matrix and the at least one force vector in a local coordinate system format that is local to the each of the plurality of elements.

24. The apparatus of claim 21, wherein the software program is operable to perform the finite element analysis by determining, for the each of the plurality of elements, a stiffness matrix and at least one force vector based on the modules of elasticity, the stiffness matrix and the at least one force vector in a local coordinate system format that is local to the each of the plurality of elements, and wherein the software program is further operable to transform the stiffness matrix and the at least one force vector into a global coordinate system format that is used for all of the plurality of elements.

25. The apparatus of claim 21, wherein the software program is operable to perform the finite element analysis by determining, after converging on a solution, a global stiffness matrix from a sum of a plurality of respective stiffness matrices of the plurality of elements, and wherein the software program is further operable to determine, for the each of the plurality of elements, a springback position by calculating the inverse of the global stiffness matrix.

26. The apparatus of claim 21, wherein at least one of the plurality of elements is a quadrilateral, and further comprising designating at least twelve nodes along the nodal lines of the quadrilateral, wherein four of the at least twelve nodes are respectively disposed on the four corners of the quadrilateral.

27. The apparatus of claim 21, wherein at least one of the plurality of elements is a triangular geometry, and further comprising designating at least ten nodes for the triangular geometry, wherein three of the at least ten nodes are respectively disposed on the three corners of the triangular geometry and at least one of the at least ten nodes are disposed at the approximate center of the triangular geometry.

28. The apparatus of claim 21, wherein the mesh is generated using the technique of parasolid faceting.

29. The apparatus of claim 21, wherein the elastic deformation range transitions into the plastic deformation range at a point associated with the yield stress of the material, and wherein the software program is operable to approximate the modulus of elasticity for each element by determining that the value of strain calculated from the previously calculated element displacement has reached the point of yield stress and in response, determine that the modulus of elasticity is in the plastic deformation range.

30. The apparatus of claim 21, wherein the software program is operable to approximate the modulus of elasticity by using the effective stress imposed on the element, the effective stress calculated using the Von Mises criterion.

31. A system for modeling displacement of a material within a computer-aided analysis environment, comprising:
  a computer system having a display unit, an input device, and a processor;
  a computer readable medium coupled to the computer system, the computer readable medium comprising a software program operable to be executed on the processor and to:
    receive an elastic deformation range and a plastic deformation range of the material;
    model a region of the material with a mesh comprising a plurality of elements; and
    determine, by performing a finite element analysis on the mesh by the computer, a displacement for at least one point on each of the elements, the displacement resulting from a set of modeled boundary conditions, the finite element analysis including recurrently approximating the modulus of elasticity for each element according to the elastic deformation range and the plastic deformation range based on a value of strain calculated from a previously calculated element displacement.

32. The system of claim 31, wherein the each of the plurality of elements comprises at least one node and performing the finite element analysis comprises determining that a displacement of each of the at least one node is within a predetermined modeling tolerance.

33. The system of claim 31, wherein the software program is operable to perform the finite element analysis by determining, for the each of the plurality of elements, a stiffness matrix and at least one force vector based on the modules of elasticity, the stiffness matrix and the at least one force vector in a local coordinate system format that is local to the each of the plurality of elements.

34. The system of claim 31, wherein the software program is operable to perform the finite element analysis by determining, for the each of the plurality of elements, a stiffness matrix and at least one force vector based on the modules of elasticity, the stiffness matrix and the at least one force vector in a local coordinate system format that is local to the each of the plurality of elements, and wherein the software program is further operable to transform the stiffness matrix and the at least one force vector into a global coordinate system format that is used for all of the plurality of elements.

35. The system of claim 31, wherein the software program is operable to perform the finite element analysis by determining, after converging on a solution, a global stiffness matrix from a sum of a plurality of respective stiffness matrices of the plurality of elements, and wherein the software program is further operable to determine, for the each of the plurality of elements, a springback position by calculating the inverse of the global stiffness matrix.

36. The system of claim 31, wherein at least one of the plurality of elements is a quadrilateral, and further comprising designating at least twelve nodes along the nodal lines of the quadrilateral, wherein four of the at least twelve nodes are respectively disposed on the four corners of the quadrilateral.

37. The system of claim 31, wherein at least one of the plurality of elements is a triangular geometry, and further comprising designating at least ten nodes for the triangular geometry, wherein three of the at least ten nodes are respectively disposed on the three corners of the triangular geometry and at least one of the at least ten nodes are disposed at the approximate center of the triangular geometry.

38. The system of claim 31, wherein the mesh is generated using the technique of parasolid faceting.

39. The system of claim 31, wherein the elastic deformation range transitions into the plastic deformation range at a point associated with the yield stress of the material, and wherein the software program is operable to approximate the modulus of elasticity for each element by determining that the value of strain calculated from the previously calculated element displacement has reached the point of yield stress and in response, determine that the modulus of elasticity is in the plastic deformation range.

40. The system of claim 31, wherein the software program is operable to approximate the modulus of elasticity by using the effective stress imposed on the element, the effective stress calculated using the Von Mises criterion.

* * * * *